United States Patent [19]

Meijer

[11] 3,987,318

[45] Oct. 19, 1976

[54] ADJUSTABLE TEMPERATURE ACTUATED SWITCHING APPARATUS

[75] Inventor: Robert S. Meijer, Montreal, Canada

[73] Assignee: Multi-State Devices Ltd., Dorval, Canada

[22] Filed: Dec. 6, 1974

[21] Appl. No.: 530,389

[52] U.S. Cl. .............................. 307/310; 307/298; 307/117; 338/22 SD; 357/28
[51] Int. Cl.² .................... H01V 3/00; H03K 19/14; H03K 17/84; H01C 7/10
[58] Field of Search ................. 307/298, 310, 117; 328/3; 357/28, 4, 51; 338/22 R, 22 SD, 25

[56] References Cited
UNITED STATES PATENTS

| | | | |
|---|---|---|---|
| 3,543,104 | 11/1970 | Umeda ........................... | 338/22 SD |
| 3,546,491 | 12/1970 | Berglund ........................ | 307/298 |
| 3,719,797 | 3/1973 | Andrews, Jr. et al ............ | 357/28 |
| 3,809,929 | 5/1974 | Vittoz ............................ | 307/310 |

FOREIGN PATENTS OR APPLICATIONS 47-28510  7/1972  Japan ............................ 338/22 SD Primary Examiner—Stanley D. Miller, Jr.
Attorney, Agent, or Firm—Spencer & Kaye

[57] ABSTRACT

An adjustable temperature actuated switching apparatus using a fixed transition type negative temperature coefficient device is disclosed. Such device exhibits regenerative switching at a predetermined temperature and power level and a monotonic shift in the power level required to induce regenerative switching, this shift being a function of ambient temperature at the device. The apparatus comprises means for passing a controlled current through the device to thermally bias the same so as to make it switch at a desired ambient temperature at the device below its transition temperature, and means for detecting regenerative switching of such device as an indication that the desired temperature at the device has been reached. The source of controlled current may be a D.C. or an A.C. source.

9 Claims, 4 Drawing Figures

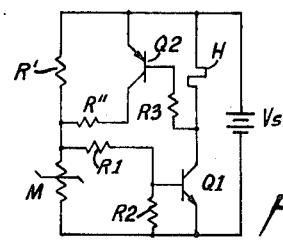
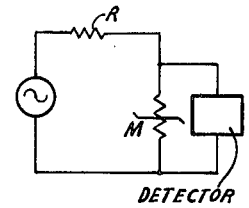
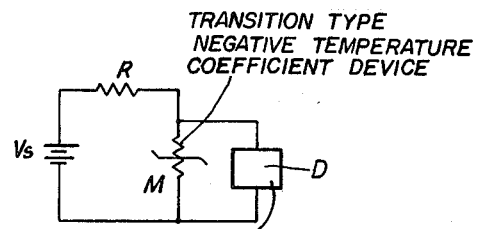
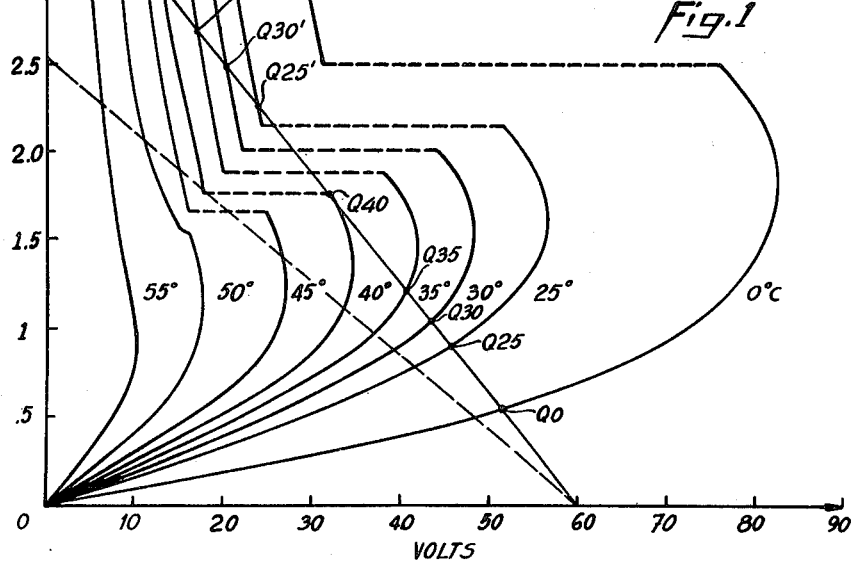

ADJUSTABLE TEMPERATURE ACTUATED SWITCHING APPARATUS

This invention relates to an adjustable temperature actuated switching apparatus using fixed transition type negative temperature coefficient devices operated in their regenerative switching or thermal avalanche mode.

The expression "regenerative switching devices" is used hereinafter to designate devices exhibiting avalanche behaviour due to their very high negative temperature coefficient of resistance. As commonly known, avalanche behaviour is due to a current crowding effect in which current crowding leads to local heating in the device which in turn leads to further current crowding. On completion of this process, most of the device current flows through a very narrow filament in the device. Because of the relatively low resistance of the conducting material, total device resistance becomes quite low. Such devices therefore behave like switches and go from a high resistance to a low resistance state in a very short period of time.

The use of transition type negative temperature coefficient devices as fixed point temperature sensing devices is well known in the art. By connecting them to appropriate circuit elements, they may act as absolute temperature sensors and operate as solid state switching devices when the absolute temperature to be sensed exceeds their transition temperature. However, the above devices operate at a fixed transition temperature and, consequently, such devices can only sense fixed temperature conditions.

It is the object of the present invention to provide an apparatus that enables the above negative temperature coefficient device to switch at any ambient temperature at the device lower than their normal transition temperature.

The adjustable temperature actuated switching apparatus, in accordance with the invention, comprises a fixed transition type negative temperature coefficient device exhibiting regenerative switching at a predetermined temperature and power level and a monotonic shift in the power level required to induce such regenerative switching as a function of ambient temperature at the device, means for passing a controlled current through the device to thermally bias the same so as to make it switch at any predetermined ambient temperature at the device below its normal transition temperature, and means for detecting regenerative switching of such device as an indication that the desired temperature at the device has been reached.

The means for passing a controlled current through the device may consist of a resistor connected in series with the negative temperature coefficient device and a source of controlled voltage applied to such series combination.

The voltage source and/or the resistor may be variable devices so as to permit adjustment in a predetermined manner of the thermal bias for operation at various ambient temperatures at the device.

The commonly known transition type negative temperature coefficient devices exhibit a certain amount of hysteresis after switching when a D.C. current is fed through them. Once the device has been switched the ambient has to be greatly reduced in temperature before the device will switch off. Consequently, such devices can only be used for sensing a predetermined ambient condition or for controlling such condition with known dead-band. Under D.C. operation, the D.C. current through the device may be reduced after switching thereof so as to compensate for hysteresis in the device.

It is therefore another object of the present invention to provide an apparatus using the above transition type negative temperature coefficient devices which may be used for both sensing an continuously controlling an ambient temperature condition without requiring expensive hysteresis compensation apparatus.

The temperature actuated switching apparatus, in accordance with a second feature of the present invention, comprises means for passing a controlled A.C. current of sufficient amplitude through the device to insure regenerative switching action at the peak value of the A.C. waveform when the desired temperature has been initially reached. The thermal and electrical time constants of the device should preferably be small relative to the period of the A.C. current so that the device will switch off at every half cycle in order to completely eliminate hysteresis.

It has been found that thin film devices give particularly good results in the above disclosed switching apparatus. A particularly suitable device is one made of vanadium dioxide or doped vanadium dioxide although other devices exhibiting a sharp negative resistance characteristic at a fixed temperature may be used. These devices include vanadium sesquioxide, titanium oxide and silver sulphide devices.

The invention will now be disclosed, by way of example, with reference to the accompanying drawings in which:

FIG. 1 illustrates the various current-voltage characteristics exhibited by a vanadium oxide device depending on the ambient temperature at the device;

FIG. 2 illustrates a preferred embodiment of a temperature sensing apparatus in accordance with the invention;

FIG. 3 illustrates a temperature controller using a sensing apparatus similar to FIG. 2 and further provided with means for compensating for hysteresis; and FIG. 4 illustrates a sensing apparatus identical to the one of FIG. 2 except that it is operated by an A.C. source.

Referring to FIG. 1, there is shown the various current-voltage characteristics exhibited by a doped vanadium dioxide thin film device having a normal transition temperature of 57° C depending on the ambient temperature at the device. The above mentioned curves were plotted using a thin film chip contained in a well known TO18 casing itself located in a surrounding medium such that the temperature of the casing is substantially identical to that of the surrounding medium.

It will be seen that the above mentioned device exhibits a monotonic shift in its current-voltage characteristic as a function of ambient temperature at the device, which shift is proportional to the power level required to induce regenerative switching to it. It is to be noted that the shift must also be monotonic in order that the apparatus may give an accurate and unambiguous indication of temperature.

To make the device operate at a predetermined temperature of, for example, 40° C, it will be necessary to apply power to it such that, for ambient temperature below 40° C, the device will remain in a high resistance state, while on passing through 40° C, the device will switch to its low resistance state. Such power is applied by feeding controlled current through the device. As illustrated in FIG. 2, the circuitry for applying power to the device may be a resistor R connected in series with the device and a controlled source of voltage Vs connected to the series combination. The circuitry will give a load line as illustrated in FIG. 1 assuming that the voltage Vs is 60 volt and the resistor R is 16 Kohms. It will be easily understood that, as the ambient temperature goes from 0° to 25°, 30° C, etc., the operating point of such a device will go from Q0 to Q25, Q30 etc. depending on the temperature at the device. When the ambient temperature reaches 40° C the operating point will reach Q40 and then shift to Q40'. The device will operate, i.e. switch from its high resistance state to its low resistance state. The switching of the device to its low resistance state may be detected by any suitable device or circuitry D to indicate the change of resistance of the device M. Such monitoring device may also be used to operate directly a temperature controller.

It will be easily understood that the above circuitry may be set for operation at temperatures other than 40° C by varying either the voltage V or the resistance of the load resistor R in a controlled manner so as to move the load line to other operating points.

If the temperature decreases, after the device M has switched on, the operating point will shift from Q40' to Q35', Q30', Q25', as the temperature goes from 40° C to 35°, 30°, 25° C. Consequently, the device M will turn off when the ambient temperature gets a few degrees below 25° C in the example of FIG. 1. If the sensing circuit D is used to operate a temperature controller, for example, there will be a wide temperature variation before the heat is switched back off again. In order to minimize this variation, means must be provided to reduce the current passed through the device M after the negative temperature coefficient device has switched to its low resistance state. This may be done by varying the value of resistance R in series with device M. FIG. 3 illustrates an example of a temperature controller using a sensing apparatus similar to the one of FIG. 2 and provided with means for compensating for temperature hysteresis. The controller comprises a heater H connected in series with a transistor Q1 across the D.C. source Vs. The temperature sensing apparatus includes a regeneratively switching negative temperature coefficient device M in series with a parallel arrangement consisting of resistor R' and resistor R'' in series with transistor Q2. The detector part of the sensing apparatus consists of resistors R1 and R2 and transistor Q1. The conduction of transistor Q2 is controlled through resistor R3.

When the device M is in its high resistance state, the voltage appearing across resistors R1 and R2 is high enough to render transistor Q1 conductive. Power is applied to the heater H and the ambient temperature raises gradually.

Transistor Q2 is conductive when transistor Q1 is conductive due to the connection of resistor R3. Thus, resistors R' and R'' are connected in parallel and their total resistance is selected such that a current of sufficient value is fed through device M to thermally bias the device so that at a predetermined temperature, such as a temperature of 40° C, the device M will operate. If we assume that the value of $V_s$ is 60 volts and the total resistance value of R' and R'' is 16 Kohms, then the load line of such an arrangement will be exactly as shown in FIG. 1. When the device M switches to its low resistance state, the potential applied across resistor R2 is instantly decreased to a point where transistor Q1 becomes non-conductive and transistor Q2 also becomes non-conductive. In this case, resistor R' alone remains in series with the device M and the load line is moved to the position illustrated in dash line in FIG. 1 so that as soon as the ambient temperature decreases slightly below 40° C, the device M is returned to its high resistance state. The above arrangement will thus maintain the temperature constant at about 40° C.

FIG. 4 illustrates a circuit, in accordance with a second feature of the present invention, which eliminates hysteresis in a very simple manner. The temperature sensing apparatus is exactly the same as the one illustrated in FIG. 2 except that an A.C. voltage source is connected thereto in place of the D.C. source Vs. If the value of resistor R and the peak value of the A.C. voltage source have the same value as in FIG. 2, then the load line of such an arrangement will be approximately as in FIG. 1 except that it will move parallel to the load line shown in full as the instantaneous value of the A.C. voltage goes from 0 to its maximum value and down to 0 in the positive and negative portions of the cycle. If we assume that the ambient temperature to be sensed is still 40° C, the load line will not move far enough to the right in FIG. 1 to cause switching of device M. However, when the temperature gets slightly above 40° C, the device M will switch to its low resistance state on each half cycle and such switching will be sensed by detector D. As soon as the voltage of the source is reduced, the device M will be turned off at every half cycle of the A.C. waveform. The detector may, by well known circuitry, transform the sensed signal into a suitable output for controlling, for example, a triac connected in series with a temperature conditioner across the A.C. source.

It will be understood that the device may be thermally biased by a variety of other means than the one disclosed above as long as the current through the device M can be carefully controlled. In all cases, however, the power appled to the device M must be controlled, in a predetermined manner, in order to have the device operate, i.e. switch at a predetermined ambient temperature.

In order to achieve a negative temperature coefficient device which operates at a high speed and low power, a preferred embodiment is a thin film device of vanadium dioxide or doped vanadium dioxide about 2,000 Å thick with an active area of about 0.005 inch by 0.0025 inch on a saphire chip about 0.011 inch by 0.018 inch and 0.006 inch thick. Such a device is capable of regenerative switching operation at frequencies above 100 Kilohertz. The construction of the device is such that the internal heat generated is generally small allowing a minimum difference between casing temperature and temperature of the measured medium. This construction is such that the internal temperature gradient is very large in relation to the casing to medium gradient and that, for all intent and purposes, the casing to medium gradient can be neglected when the device is utilized in the above disclosed temperature actuated switching apparatus.

The above disclosed apparatus is used not only to sense the ambient temperature at a device M in a medium having a heat capacity sufficient to secure a casing temperature substantially identical to the measured temperature of the medium. It can also be used to sense a change in heat capacity of a medium having a limited heat capacity and a fixed temperature. For example, a probe with the negative temperature coefficient device M can be configured to sense a change in air flow surrounding the device. It is obvious that the amount of power required to switch such a device will increase in high air flow or in a medium having a higher heat capacity than still air. Similarly, a probe in water will require much greater power than one in still air. This is due to the fact that the rate of heat removal from the immediate vicinity of the device varies with the medium in which the device is located.

Although the invention is disclosed with reference to preferred embodiments thereof, it is to be understood that various means may be used to feed a current of controlled value to the transition type negative temperature coefficient device to make it switch. In addition, various combinations of circuitry and packaging techniques may also be used to modify the basic sensing apparatus to make it sense a predetermined ambient temperature. Although it is particularly advantageous to feed A.C. current through the device, it is to be understood that D.C. current may also be fed through it to make it switch when hysteresis is either desired, insignificant or can be easily compensated for.

I claim:

1. An adjustable temperature actuated switching apparatus comprising:
   a. a fixed transition type negative temperature coefficient device exhibiting regenerative switching at a predetermined temperature and power level and a monotonic shift in the power level required to induce regenerative switching, said shift being a function of ambient temperature at the device;
   b. means for passing a controlled current through said device to thermally bias the device so as to make the device switch at a desired ambient temperature at the device below its transition temperature; and
   c. means for detecting regenerative switching of said device as an indication that the desired ambient temperature at the device has been reached.

2. An adjustable temperature actuated switching apparatus as defined in claim 1, wherein said means for passing a controlled current through said device includes an impedance connected in series with the negative temperature coefficient device and a source of controlled voltage applied to said series combination.

3. An adjustable temperature actuated switching apparatus as defined in claim 2, wherein said voltage source and said impedance are variable so as to permit adjustment of thermal bias for operation at various desired ambient temperature at the device.

4. An adjustable temperature actuated switching apparatus as defined in claim 1, wherein said current is a D.C. current and further comprising means for reducing the current passed through the device after regenerative switching so as to reduce hysteresis in the device.

5. An adjustable temperature actuated switching apparatus as defined in claim 1, wherein said current is an A.C. current and wherein the thermal and electrical time constants of the device are small relative to the period of the A.C. current in order to cause the device to switch at every half cycle of said A.C. current so as to completely eliminate the hysteresis in the device.

6. An adjustable temperature actuated switching apparatus as defined in claim 1, wherein said negative temperature coefficient device is a thin film device.

7. An adjustable temperature actuated switching apparatus as defined in claim 6, wherein said thin film device is made of vanadium dioxide material.

8. An adjustable temperature actuated switching apparatus as defined in claim 6, wherein said thin film device is made of doped vanadium dioxide material.

9. An adjustable temperature actuated switching apparatus as defined in claim 4 wherein: said means for detecting includes first circuit means, responsive to the switching state of said device, for switching between its high resistance state and its low resistance state respectively; and said means for reducing the current includes second circuit means, responsive to the state of conduction of said first circuit means, for reducing the current passed through the device only when said first circuit means is in said second state of conduction.

* * * * *